(12) United States Patent
Kaneko et al.

(10) Patent No.: US 7,483,002 B2
(45) Date of Patent: *Jan. 27, 2009

(54) PICTURE IMAGE DISPLAY DEVICE AND METHOD OF DRIVING THE SAME

(75) Inventors: Yoshiyuki Kaneko, Hachioji (JP); Sukekazu Aratani, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 653 days.

This patent is subject to a terminal disclaimer.

(21) Appl. No.: 10/821,847

(22) Filed: Apr. 12, 2004

(65) Prior Publication Data

US 2004/0196219 A1    Oct. 7, 2004

Related U.S. Application Data

(62) Division of application No. 09/821,022, filed on Mar. 30, 2001, now Pat. No. 6,738,034.

(30) Foreign Application Priority Data

Jun. 27, 2000    (JP) .............................. 2000-192824

(51) Int. Cl.
    G09G 3/30    (2006.01)
(52) U.S. Cl. ...................................... 345/76; 315/169.3
(58) Field of Classification Search .............. 345/76–84
    See application file for complete search history.

(56) References Cited

U.S. PATENT DOCUMENTS

| | | | |
|---|---|---|---|
| 4,866,348 A * | 9/1989 | Harada et al. ............ | 315/169.3 |
| 5,550,066 A | 8/1996 | Tang et al. | |
| 5,708,452 A | 1/1998 | Takahashi | |
| 5,903,246 A | 5/1999 | Dingwall | |
| 5,923,308 A | 7/1999 | Wei et al. | |
| 5,952,789 A | 9/1999 | Stewart et al. | |

(Continued)

FOREIGN PATENT DOCUMENTS

JP    04-308687    10/1992

(Continued)

OTHER PUBLICATIONS

H. Ishiguro et al., "Consideration on Motion Picture Quality of the Hold Type Display with an octuple-rate CRT," *The Institute of Electronics, Information and Communication Engineers*, Technical Report EID 96-4 (Jun. 1996), pp. 19-26.

*Primary Examiner*—Duc Q Dinh
(74) *Attorney, Agent, or Firm*—Antonelli, Terry, Stout & Kraus, LLP.

(57) ABSTRACT

Pixels in a picture image display device are driven in such a manner that while introducing light, a quenching period is initiated in which electro optical elements in the pixels are quenched after scanning a plurality of gate lines for displaying one picture image. In other words, the pixels are driven while interposing the light quenching period in which the electro optical elements are quenched between one frame and a subsequent frame. Thereby, the phenomenon of blurred edges at the time of motion picture display, when the pixels including the electro optical elements are driven through an active matrix drive circuit, is suppressed and the picture quality of the picture image display device is improved.

25 Claims, 11 Drawing Sheets

U.S. PATENT DOCUMENTS

| | | | |
|---|---|---|---|
| 5,986,632 A | 11/1999 | Takayama et al. | |
| 6,215,244 B1 | 4/2001 | Kuribayashi et al. | |
| 6,229,508 B1 | 5/2001 | Kane | |
| 6,359,605 B1 | 3/2002 | Knapp et al. | |
| 6,373,454 B1 | 4/2002 | Knapp et al. | |
| 6,392,620 B1 * | 5/2002 | Mizutani et al. | 345/88 |
| 6,583,775 B1 * | 6/2003 | Sekiya et al. | 345/76 |

FOREIGN PATENT DOCUMENTS

| | | |
|---|---|---|
| JP | 4-328791 | 11/1992 |
| JP | 8-241048 | 9/1996 |
| JP | 09-138659 | 5/1997 |
| JP | 10-254390 | 9/1998 |
| JP | 11-119189 | 4/1999 |
| JP | 2000-122596 | 4/2000 |
| JP | 2000-163014 | 6/2000 |
| JP | 2000-347621 | 12/2000 |
| JP | 2001-060076 | 3/2001 |
| JP | 2002-517806 | 6/2002 |
| JP | 2002-518691 | 6/2002 |
| WO | WO98/36407 | 8/1998 |

\* cited by examiner

PICTURE IMAGE DISPLAY DEVICE AND METHOD OF DRIVING THE SAME

CROSS-REFERENCE TO RELATED APPLICATIONS

This is a division of application Ser. No. 09/821,022 filed 30 Mar. 2001, now U.S. Pat. No. 6,738,034.

BACKGROUND OF THE INVENTION

The present invention relates to an active matrix type of picture image display device and to a method of driving the same, in which the light emitting operation of an electro optical element, whose emission is caused by a drive current flowing through a light emitting thin film, such as an organic semiconductor film, is controlled by switching elements, such as thin film transistors (hereinbelow referred to as TFTs).

In response to the advent of a highly information oriented society, demands for devices, such as personal computers, car navigation devices, portable information terminals, information communication products and combined devices thereof, have been increasing. For these products, thin display devices that are light in weight with low electric power consumption are desirable; therefore, liquid crystal display devices or display devices including self light-emitting type electro optical elements, such as electro-luminescence elements (hereinbelow referred to as ELs) and light emitting diode elements (hereinbelow referred to as LEDs) are now being used.

Since the latter display devices including the self light-emitting type electro optical elements show advantages such as high visibility, broad visual angle and high response characteristics, which are suitable for displaying motion pictures, such because video image display will become of major importance. In particular, a rapid improvement in light emitting efficiency in the case of organic EL elements and organic LED elements (hereinbelow referred to inclusively as OLEDS) using an organic substance as a light emitting layer and development in network technology which permits video image signal communication in combination therewith have greatly increased the expectation for wide-spread use of OLED displays.

In order to enhance the power efficiency in OLED displays, an active matrix drive using thin film transistors is effective which will be explained later. Examples of technology in which an OLED display is constituted in an active matrix structure and is driven therewith are, for example, disclosed in JP-A-4-328791 (1992), JP-A-8-241048 (1996) and U.S. Pat. No. 5,550,066; and, further, a technique relating to a drive voltage of such OLED display is, for example, disclosed in PCT application laid-open No. WO98/36407.

In a typical pixel in an OLED display, the light emitting intensity of an OLED element is controlled by an active matrix element drive circuit, which is constituted by two TFTs (one is for a switching transistor and the other is for a driver transistor) and one capacitor. Pixels are arranged near respective cross points of m lines and n rows arranged in the form of a matrix, which is formed by n data lines to which picture image signals are fed and m scanning lines (or gate lines) to which scanning signals are fed.

In order to drive the pixels, through successive application of scanning signals (or gate voltages) onto the m gate lines, the respective switching transistors are turned on to complete scanning in a vertical direction once in one frame period Tf, and a turn-on voltage is again applied to the first gate line.

In the above pixel drive scheme, an interval when the turn-on voltage is applied to a single gate line is less than Tf/m. As a value for one frame period Tf about 1/60 sec is generally employed. At the time-on voltage is being applied on a certain when a turn gate line, all of the switching transistors connected to the certain gate line are placed in an on state, and in synchronism therewith picture image signals (data voltages) are applied at the same time to data lines of n rows, which is called a line-at-a-time scanning method and is commonly used in the field of active matrix type liquid crystal display devices.

The data voltage is stored in the capacitor during the time when the turn-on voltage is applied to the gate line and is kept there at substantially the same value during one frame period. The voltage value at the capacitor defines the gate voltage of the driver transistor, thus the value of current flowing through the driver transistor is regulated so as to cause a predetermined current to flow through the OLED element and to cause light emission. The response time of an OLED element in starting light emission after a voltage is applied is usually below 1 μs, therefore, the OLED element can be operated so as to follow a swift motion picture image (motion picture).

Now, with use of the active matrix drive, a high efficiency is realized,, because the light emission is effected during the entire one frame period. When comparing this active matrix drive with a simple matrix drive in which an OLED element is driven by connecting the respective diode electrodes thereof to a vertical scanning line and a horizontal scanning line without providing the TFTs, the difference in efficiency is significant.

In a simple matrix drive, the current flows through the OLED element only during the period when the vertical scanning line is selected; therefore, in order to obtain a brightness equivalent to that provided by light emission in one frame period only with such a short period light emission, a light emission intensity multiplied by about the vertical scanning line number is required in comparison with that for the active matrix drive. For fulfilling such a requirement, the drive voltage and the drive current therefor have to be inevitably increased, which increases the loss power consumption, such as heating, and can not prevent a power efficiency reduction.

As will be apparent from the above, it is believed that the active matrix drive is superior to the simple matrix drive with regard to its lower power consumption. Because of the high speed response characteristics of the OLED elements, it has been believed that such OLED elements are suitable for motion picture displays. However, the active matrix drive for such OLED elements according to the conventional art employs the same drive method as used for liquid crystal displays (LCDs), namely a hold type display method, in which the respective pixels are displayed, in other words, the respective OLED elements are caused to light-emit over one frame period.

Hidekazu Ishiguro et al. "Consideration on Motion Picture Quality of the Hold Type Display with an Octuple-rate CRT" (Technical Report of The Institute of Electronics, Information and Communication Engineers, EID 96-4 (1996-06), pp 19-26) discloses that it is unavoidable in a LCD that edges of a moving body will be blurred during motion picture display due to the hold type display method.

Although the problem of blurred edge of motion picture images was pointed out with regard to LCDS, the cause of the blurred edges is stated as being due to use of the hold type display method. Therefore, the same problem of blurred edges of motion picture images likely arises with regard to active matrix driven OLED elements, when such OLED elements are operated with the hold type display method.

As has been mentioned above, in the conventional art the blurred edges phenomenon during motion picture display when electro optical elements, such as OLED elements, are driven by active matrix circuits was not taken into account, which causes deterioration of the picture quality thereof.

SUMMARY OF THE INVENTION

An object of the present invention is to provide a picture image display device and a method of driving the same which suppresses the blurred edge phenomenon during motion picture display, when the electro optical elements included therein are driven through active matrix circuits, so as to improve the picture quality thereof.

A feature of the present invention is to drive pixels by interposing a quenching period in which the electro optical elements are quenched after scanning a plurality of gate lines for displaying one picture image. In other words, the present invention drives the pixels while forming a quenching period in which the electro optical elements are once quenched between one frame and the subsequent frame thereto.

In a preferred embodiment according to the present invention, the pixels are driven while forming a quenching period in which the electro optical elements therein are quenched within one frame period for displaying one picture image.

In accordance with the present invention,, since the pixels are driven in such a manner that a quenching period for quenching the electro optical elements is formed after scanning a plurality of gate lines for displaying one picture image, integration of a white background or background signals is eliminated at the time of line of sight movement during the quenching period, thus the occurrence of blurred edges is prevented, in other words, the display characteristics of motion pictures are greatly improved.

DETAILED DESCRIPTION OF THE PREFERRED EMBODIMENTS

Embodiments according to the present invention will be explained with reference to the drawings. At first, the structure of the picture image display device will be explained, thereafter methods of driving the same will be explained.

Figure 1:
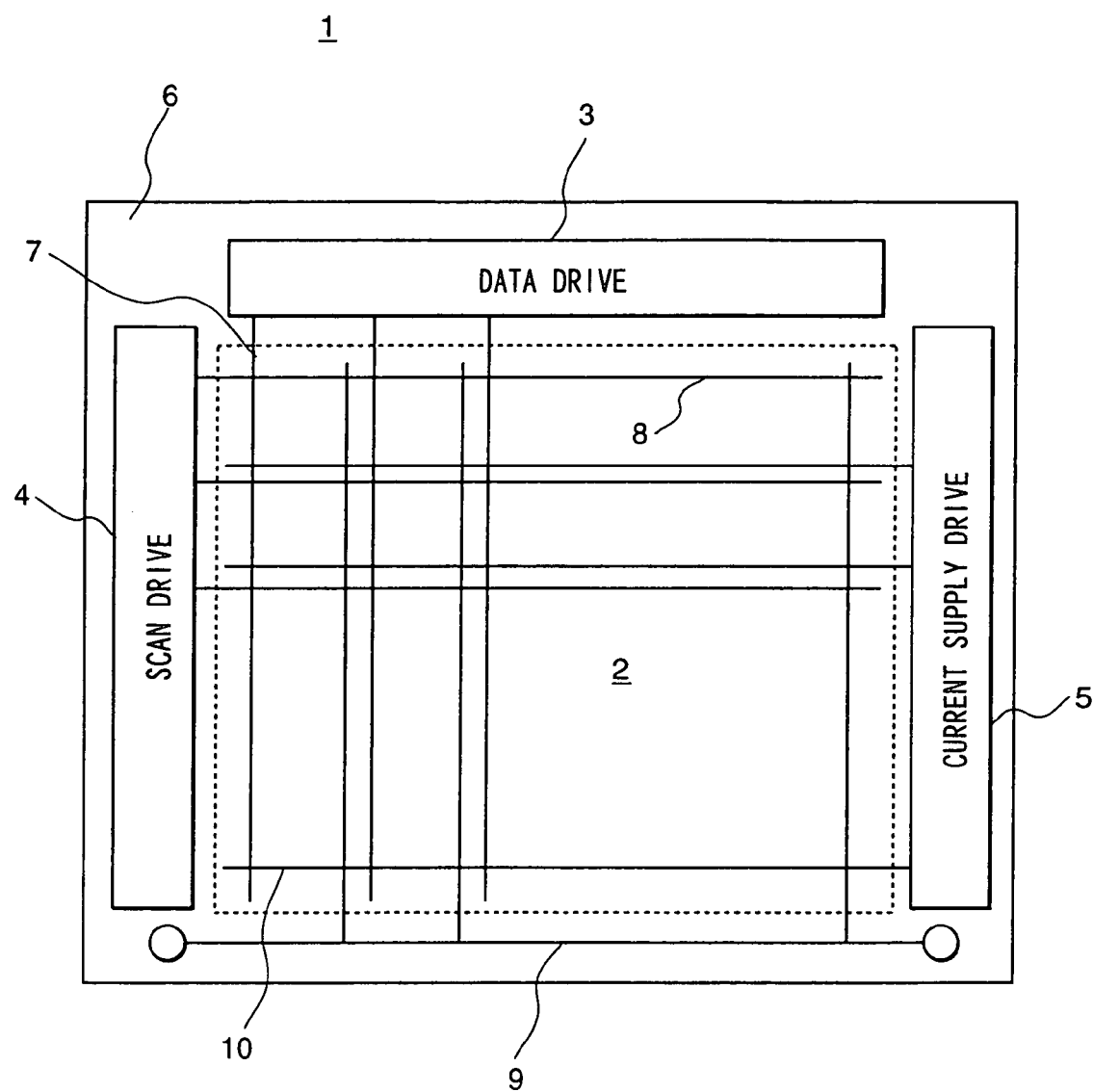
FIG. 1 is a block diagram showing an example of a picture image display device to which the present invention is applied.
Figure 2:
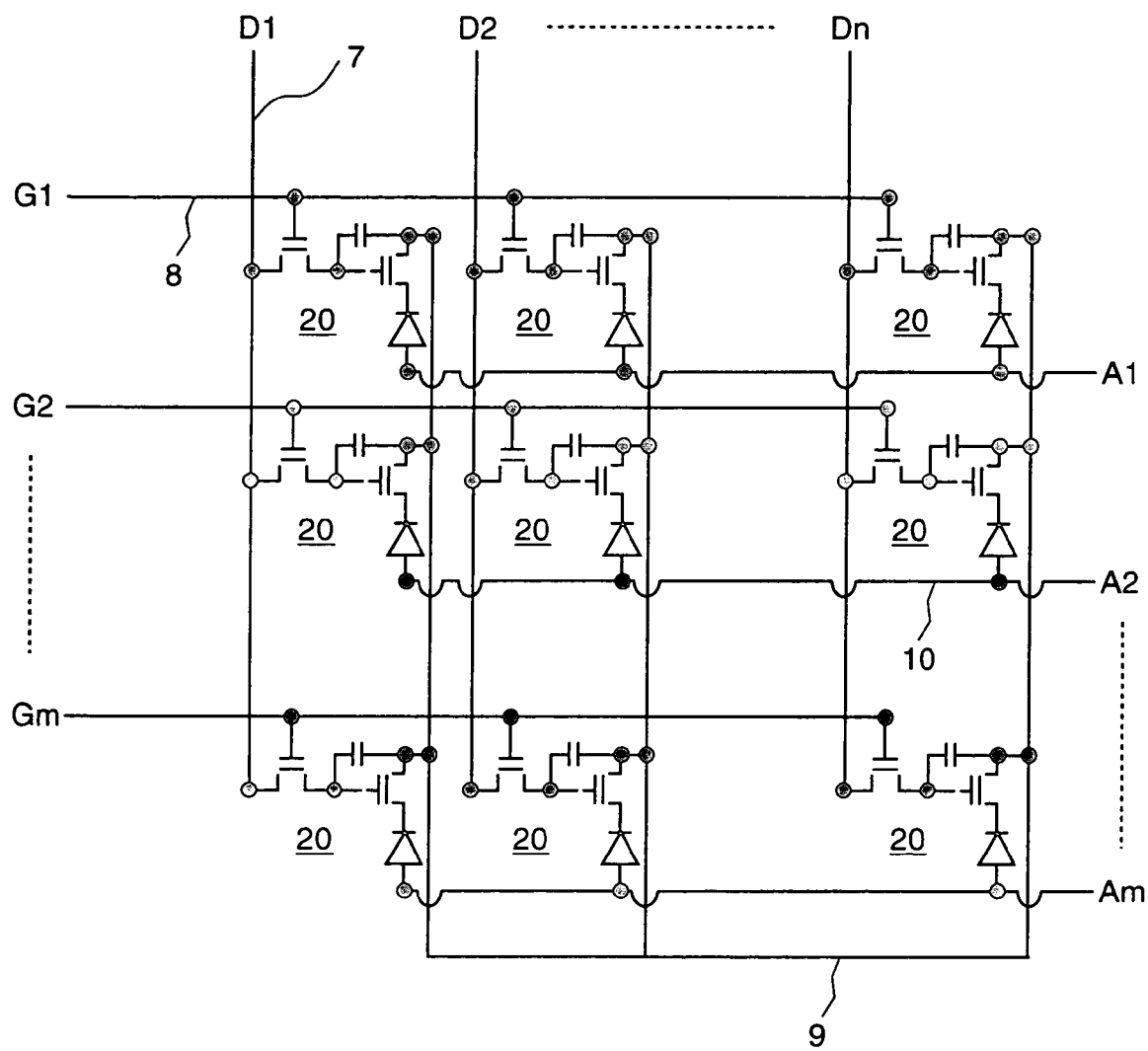
FIG. 2 is an equivalent circuit diagram of an active matrix type display unit included in the FIG. 1 example.

FIG. 1 is a block diagram showing schematically an entire lay out of a picture image display device 1, and FIG. 2 is an equivalent circuit diagram of an active matrix drive structure constituted in a display portion 2 in FIG. 1.

In FIG. 1, the display portion 2 is constituted substantially at the center portion of a substrate 6 for the picture image display device 1. At the upper side of the display portion 2, a data line driving circuit 3 is provided for feeding picture image signals for data lines 7, and at the left side thereof, a scanning line driving circuit 4 is provided for feeding scanning signals (gate voltage) for gate lines 8. Further, at the right side of the display portion 2, a current supply driving circuit 5 is provided. These driving circuits 3, 4 and 5 are respectively configured as a shift register circuit, a level shifter circuit and an analogue switching circuit, each constituted by a complementary type circuit including N channel type and P channel type TFTs.

Like an active matrix type liquid crystal display device, in the picture image display device 1, the plurality of gate lines 8 and the plurality of data lines which are extended in the direction crossing the extending direction of the gate lines 8 are provided on the substrate 6. As illustrated in FIG. 2, pixels 20 are arranged in a matrix shape defined by the gate lines 8, such as G1, G2, . . . , Gm, and the data lines 7, such as D1, D2, . . . , Dn.

Figure 3:
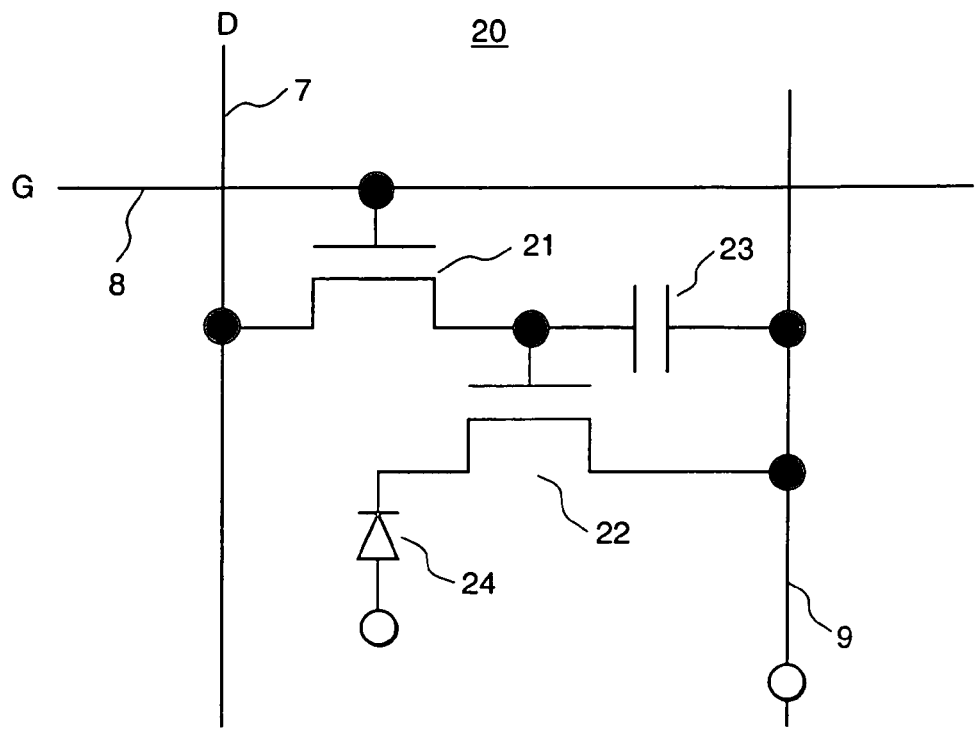
FIG. 3 is an equivalent circuit diagram of one pixel included in FIG. 2 circuit which is driven by an active matrix circuit structure.

As shown in the enlarged pixel 20 in FIG. 3, a gate electrode of a switch transistor 21 constituted by an N channel type TFT is connected to the gate line 8, one of the source electrode and the drain electrode of the switch transistor 21 is connected to the data line 7 and the other electrode thereof is connected to one terminal of a capacitor 23. The one terminal of the capacitor 23 is also connected to the gate electrode of a driver transistor 22 constituted by another N channel type TFT.

The source electrode of the driver TFT 22 is connected to a common potential line 9, which extends in the same direction as that of the data lines 7, and the drain electrode thereof is connected to one of two electrodes of an OLED 24. The other electrode of the OLED 24 is connected to one of the current supply lines 10 which are common to all of the pixels 20 and are kept at a predetermined potential Va. The OLED 24 is usually configured in such a manner that the anode thereof is formed by a transparent electrode, and the light emitted from its OLED layer is taken out toward the outside through a glass substrate 6 on which the TFTs are formed.

In this circuit structure, when the switch transistor 21 is rendered into an ON state by a scanning signal applied on one of the gate lines 8 such as G1, G2, . . . , Gm, picture image signals from the data lines 7 such as D1, D2, . . . , Dn are written into the capacitors 23 through respective switch transistors 21. Therefore, the potentials of the gate electrodes of the respective driver transistors 22 are kept at those potentials corresponding to the picture image signals by the respective capacitors 23, even when the respective switch transistors 21 are rendered into an OFF state.

Thus, the driver transistors 22 are continuously kept at their driving state under the source grounded mode, which is excellent with regard to a constant current characteristic, and a predetermined current flows from the current supply lines 10 flows to the OLEDs 24. Therefore, the OLEDs are kept at their light emitting state. The light emission intensity at this moment depends on the picture image data written into the capacitors 23. The light emission interruption is achieved by rendering the driver transistors 22 into an OFF state.

Now, a method of driving the picture image display device will be explained with reference to FIGS. 4 and 5.

Figure 4:
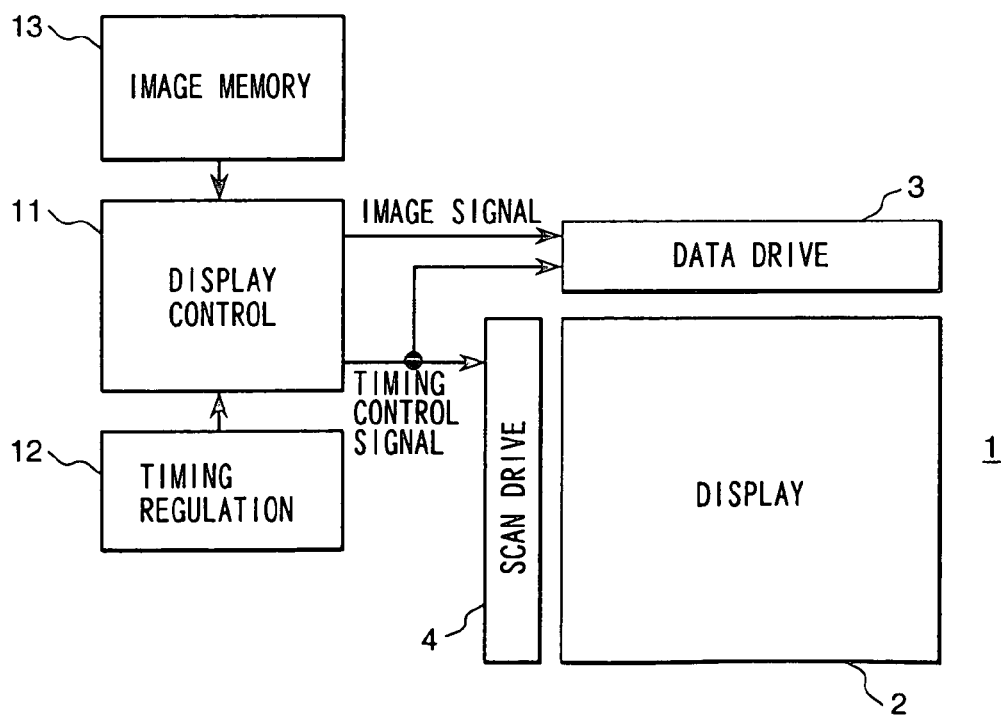
FIG. 4 is a block diagram of an embodiment according to the present invention.

FIG. 4 shows a block diagram of a driving device which drives the picture image display device according to the present invention. In FIG. 4, those elements bearing the same reference numerals as in FIG. 1 represent corresponding elements. A display control controller 11 provides timing control signals (clock signals) to the data line drive circuit 3 and the scanning line drive circuit 4. The data line drive circuit 3 is further provided with picture image signals from the display control controller 11.

The timing (clock frequency) of the display control controller 11 is regulated by a timing regulation circuit 12. The timing regulation circuit 12 sets a clock frequency which corresponds to a quadruple of the base frequency for one frame. Thereby, the display control controller 11 quadruples the data reading speed from a picture image memory 13, and sets the timing of frame start control signals for shift registers in both drive circuits 3 and 4 at t=0, Tf/4, Tf, 5Tf/4 . . . .

Figure 5:
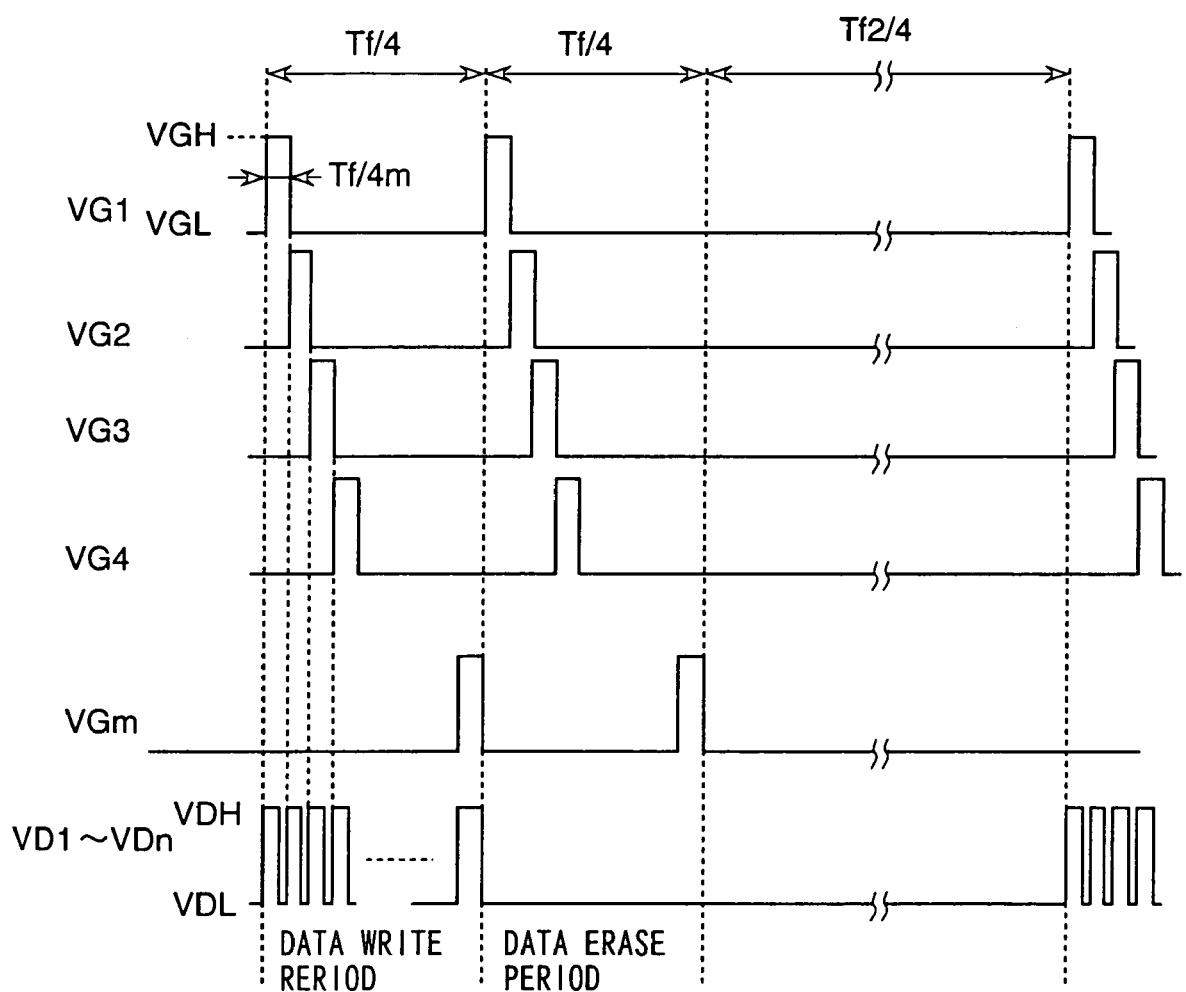
FIG. 5 is a time chart illustrating the pixel driving operation of the FIG. 4 embodiment according to the present invention.

In the above explained structure, gate voltages VG1, VG2, . . . , VGm as illustrated in FIG. 5, which successively turn on the switch transistors 21, are applied from the scanning line drive circuit 4 to the gate lines G1, G2, . . . , Gm, and the gate voltages VG1, VG2, . . . , VGm vary from a low voltage level VGL to a high voltage level VGH.

On the other hand, in synchronism with the gate voltages VG1, VG2r . . . , VGm the data voltages VD1, VD2r . . . , VDn representing picture image signals are applied from the data line drive circuit 3 to the data lines D1, D2, . . . , Dn. The picture image signal voltages VD1, VD2, . . . , VDn are set between a high voltage level VDH and a low voltage level VDL. The low voltage level VDL is usually set below the voltage of the common potential lines 9. The voltage Va of the current supply lines 10 and the voltage of the common potential lines 9 are kept constant.

Although the picture image display device is driven in the manner as explained above, the present driving method employs line-at-a-time sequential scanning as in the conventional art.

Now, according to the present invention, a period required for scanning one picture or one picture image is shortened to ¼ of one frame period Tf. Accordingly, the selection time per one gate line 8 is likely shortened to Tf/4m. After scanning of one picture is completed, and, subsequently, when the gate line G1 is again selected, data voltages VD1, VD2, VDn having a voltage value VDL which renders the driver transistors 22 into an OFF state are applied to all of the data lines D1, D2, . . . , Dn.

Under this voltage application scheme, about ¼ of one frame period becomes a light emitting period and the remaining ¾ period thereof becomes a quenching period (no light emitting period). In order to prevent a dark display image due to the shortening of effective light emitting time of the OLEDs 24, the peak value of the data voltage is determined so as to cause a quadruple current to flow. Since a value of the one frame period Tf is about 16 ms, the period used for the light emission is about 4 ms, and because of the high speed response characteristics of the OLEDs 24, the light emission can be performed over almost the entire period of about 4 ms.

How the phenomenon blurred edges of motion pictures is suppressed, when the picture image display device is driven in a manner as explained above, will be explained hereinbelow.

At first, in order to facilitate understanding of the characteristic of the present invention, how the blurred edges of motion pictures occur will be explained with reference to FIGS. 6A and 6B.

Figure 6A:
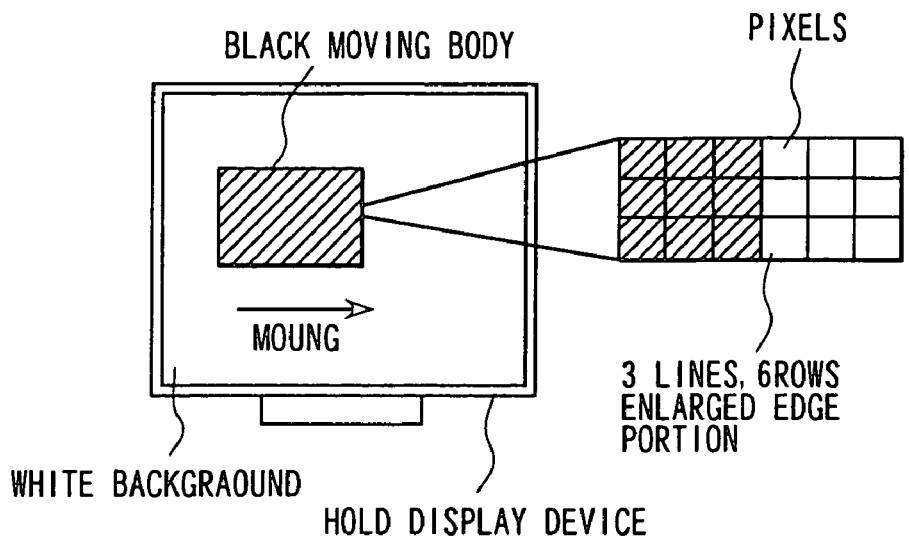
FIGS. 6A and 6B are diagrams illustrating the phenomenon of blurred edges of motion pictures with a conventional pixel driving method.

As illustrated in FIG. 6A, a video image is assumed, in which a black rectangular shape representing a motion picture image moves with a constant speed on a white background in the direction of the arrow from left to right in the drawing. When this motion picture image is displayed through a hold type display device, the display contents are rewritten every one frame interval and the display contents are held over the one frame period. Noting these two features, FIG. 6B is prepared while enlarging one horizontal line including an edge portion of the motion picture image. Namely, FIG. 6B schematically shows a change of the enlarged portion with regard to time for every Tf/4. As illustrated in FIG. 6B, the edge portion of the rectangular shape is displayed while moving in a step wise manner with respect to the passage of time. FIG. 6B shows an example in which the edge portion moves by four pixels for every one frame.

Figure 6B:
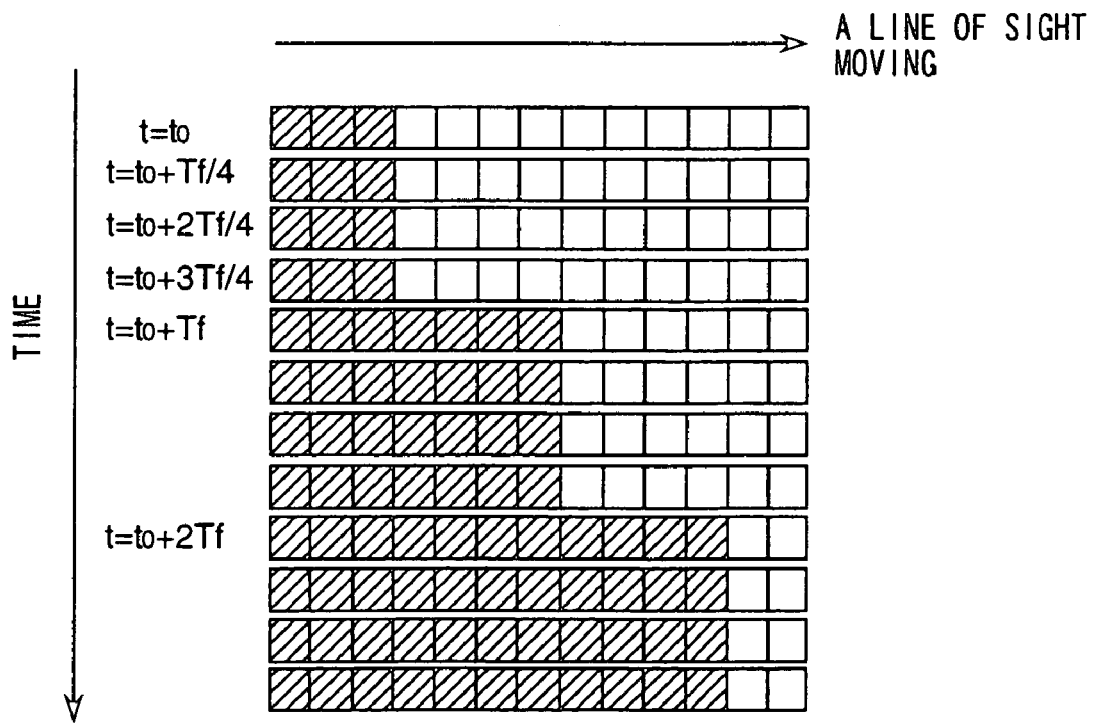

The eyes of a user which view this display picture, in that line of sight, move continuously following the motion picture image, as illustrated by the arrow A in FIG. 6B. During the movement of the line of sight, since the white background is also recognized, the brightness signal of the moving image of the motion picture image which the user perceives corresponds to an integration value of the white background signals and the black signals, which causes the edge portion of the black rectangular shape to blur.

Figure 7:
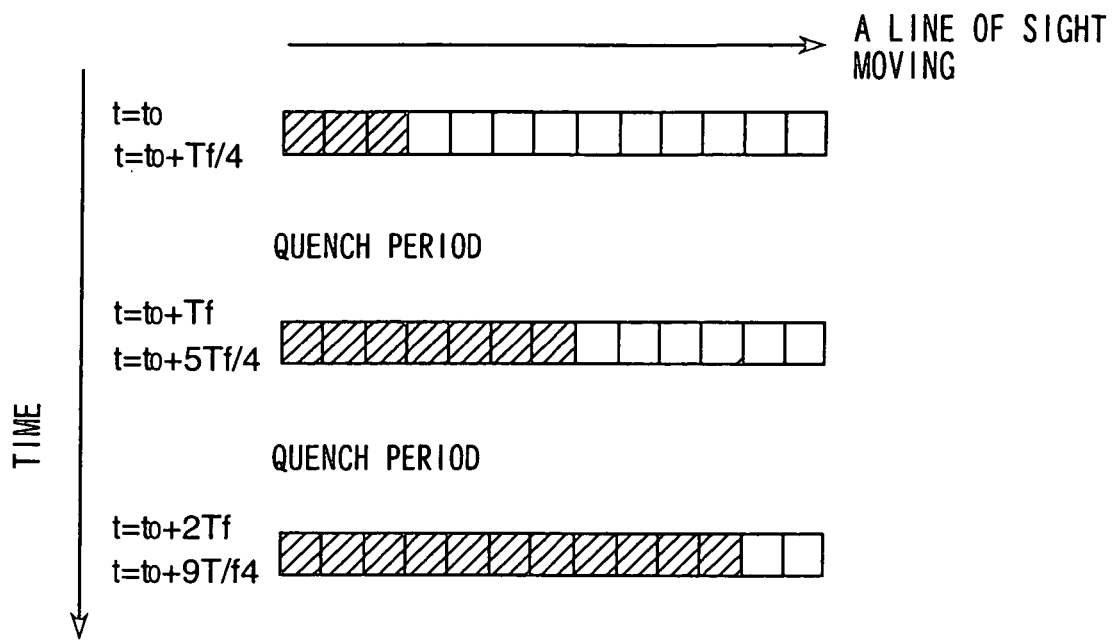
FIG. 7 is a diagram illustrating how blurred edges of motion pictures can be eliminated according to the present invention.

On the other hand, FIG. 7 shows the pixels in one line in FIG. 6B with respect to passage of time for explaining how the picture image is viewed when the pixel driving method according to the present invention is applied. On FIG. 7, for example,, during a period from time t=t0+Tf/4 to t=t0+Tf the light emission is quenched, therefore, at the time of the line of sight movement during this quenching period an integration of the white background is eliminated because of the absence of white background signals, with the result that no blurred edges occur, namely, the display characteristics of the motion picture are greatly improved.

Further, in the above embodiment, the ratio of 1:3 between light emitting period and light quenching period was used. However, in view of the fact that there is no picture quality deterioration in the display characteristics of a CRT viewing afterglow below 3 ms of a luminescent body and showing sufficient motion picture image display characteristics, the light emitting period can be further shortened with the timing regulation circuit 12 so as to reduce the power consumption.

Figure 8:
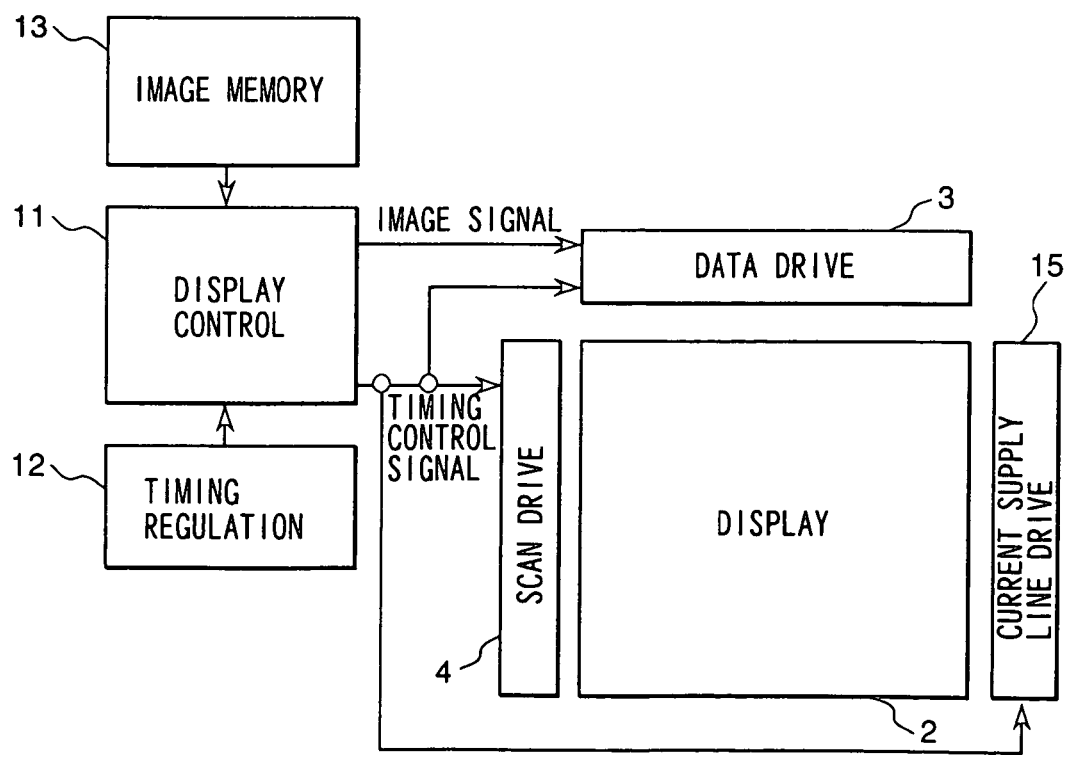
FIG. 8 is a block diagram of another embodiment according to the present invention.

FIG. 8 shows another embodiment according to the present invention.

Figure 9:
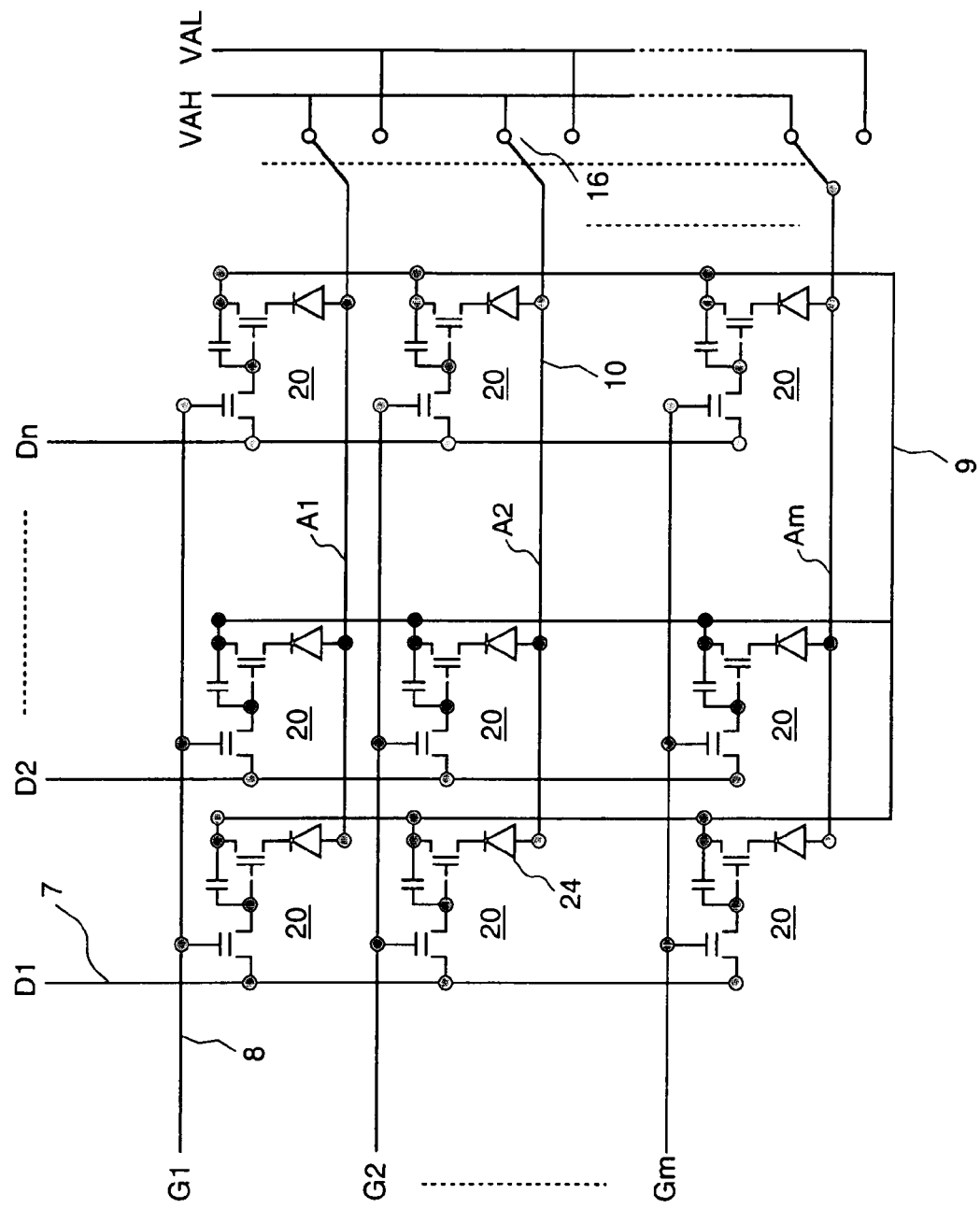
FIG. 9 is an equivalent circuit diagram of an active matrix type display unit included in the FIG. 8 embodiment according to the present invention.

In FIG. 8, the main difference from the FIG. 4 embodiment is that a current supply line drive circuit 15 placed under control of the display controller 11 is provided in place of the current supply drive circuit 5. As shown in FIG. 9, for the respective current supply lines 10, switches 16 are provided which change over supply voltages for the current supply lines 10 between VAH and VAL in association with the gate voltages for light quenching.

FIG. 9 shows a pixel matrix diagram in the display portion 2. A difference in FIG. 9 from that in FIG. 2 is that respective separate current supply lines A1, A2, . . . , Am are provided which bundle anode electrodes of the OLEDs 24 for every line and voltages VA1, VA2, . . . , VAm, each including a plurality of voltages, such as VAH and VAL, other than a single constant voltage, are applied to the respective current supply lines A1, A2, . . . , Am via the respective switches 16.

Figure 10:
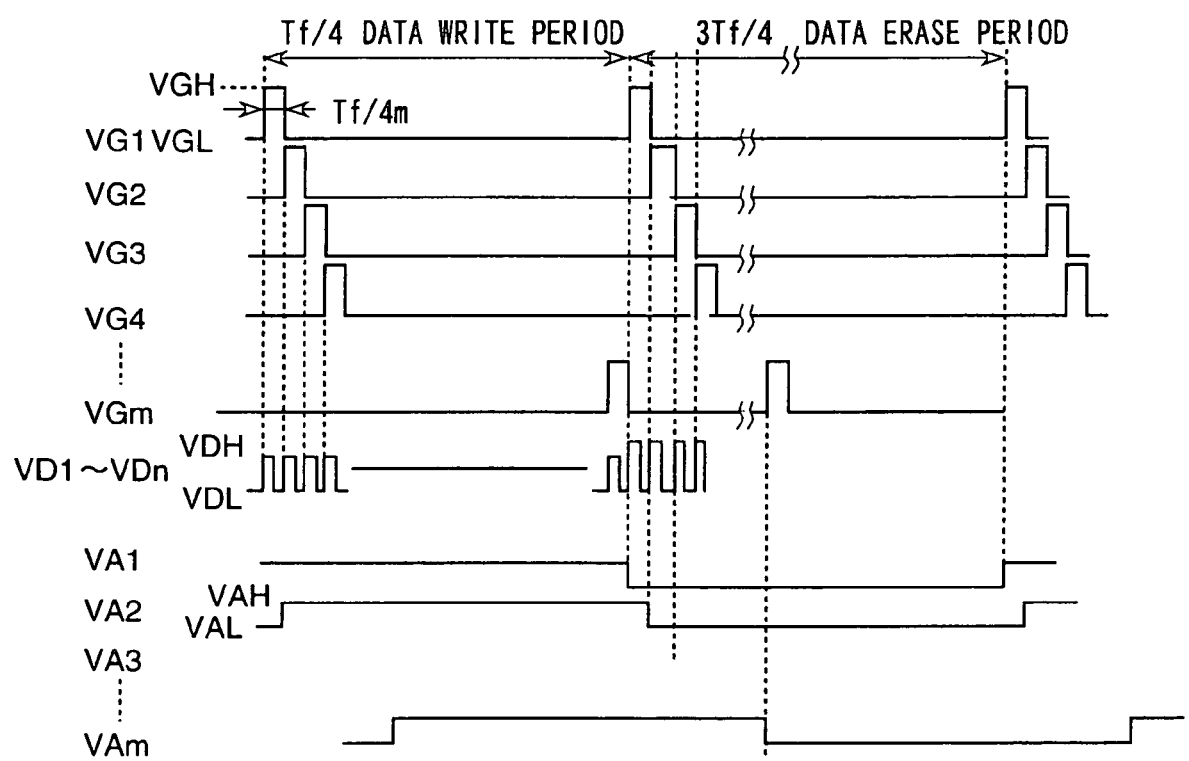
FIG. 10 is a time chart illustrating a pixel driving operation of the FIG. 8 embodiment according to the present invention.

An operation of this circuit structure will be explained with reference to the time chart as shown in FIG. 10. Since the purpose of providing the light emitting period and the light quenching period for driving the pixels in the present embodiment is substantially the same as that of the FIG. 4 embodiment, a detailed explanation thereof will not be repeated.

However, in the present embodiment, after completing the light emitting period for one frame, at the time of reselection of the gate lines 8, a voltage is applied to the driver transistors 22, which turns on the same in a non-saturated region thereof, and, at the same time, the voltages VA1, VA2, . . . , VAm provided to the current supply lines A1, A2, . . . , Am by the current supply line drive circuit 15 are reduced to the low voltage level VAL. The low voltage level VAL is set lower than the voltage level of the common potential lines 9.

When the voltages VA1, VA2, . . . , VAm at the current supply lines A1, A2, . Am are reduced to the low voltage level VAL, the potential of the pixel electrodes of the OLEDs 24 assumes about the voltage level of the common potential lines 9; thereby, the voltage between both ends of the OLEDs 24 shows an inverted bias direction relative to that during light emission. Therefore, when the driver transistor 22 is turned off at this moment, the above bias voltage application condition is held over the light quenching period. Such inverted or backward bias voltage application can be realized, because the current supply lines 10 in a stripe shape are arranged in parallel with the gate lines 8.

If a DC forward bias is continuously applied to an OLED 24, a space charge is gradually generated therein which reduces the brightness thereof. However, when an inverted bias as in the present embodiment is applied to the OLED 24, the generation of the space charge is prevented, which prolongs the life of the OLED 24.

Figure 11:
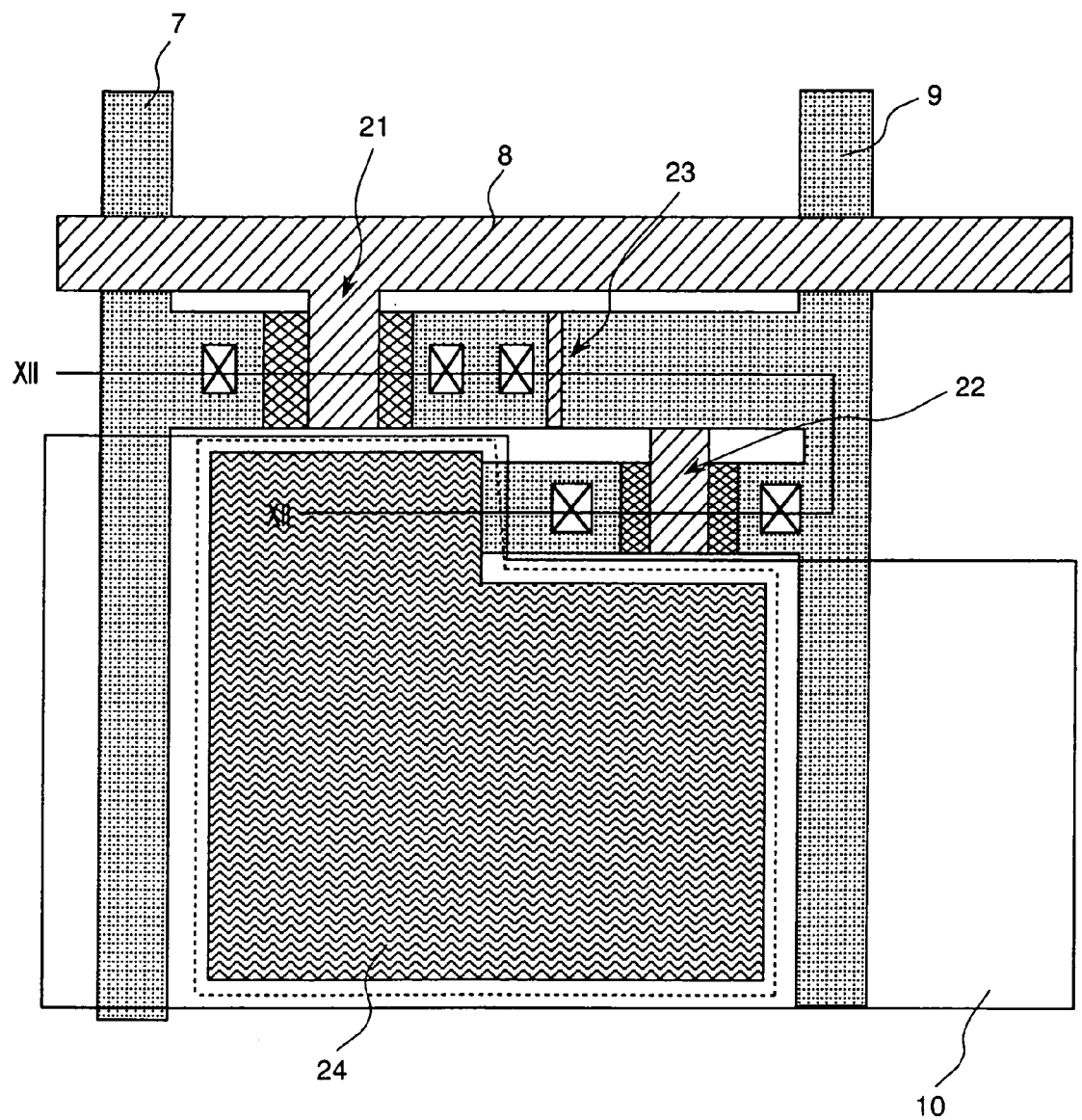
FIG. 11 is a partial sectional view illustrating the plane structure of a pixel portion in a picture image display device according to the present invention.
Figure 12:
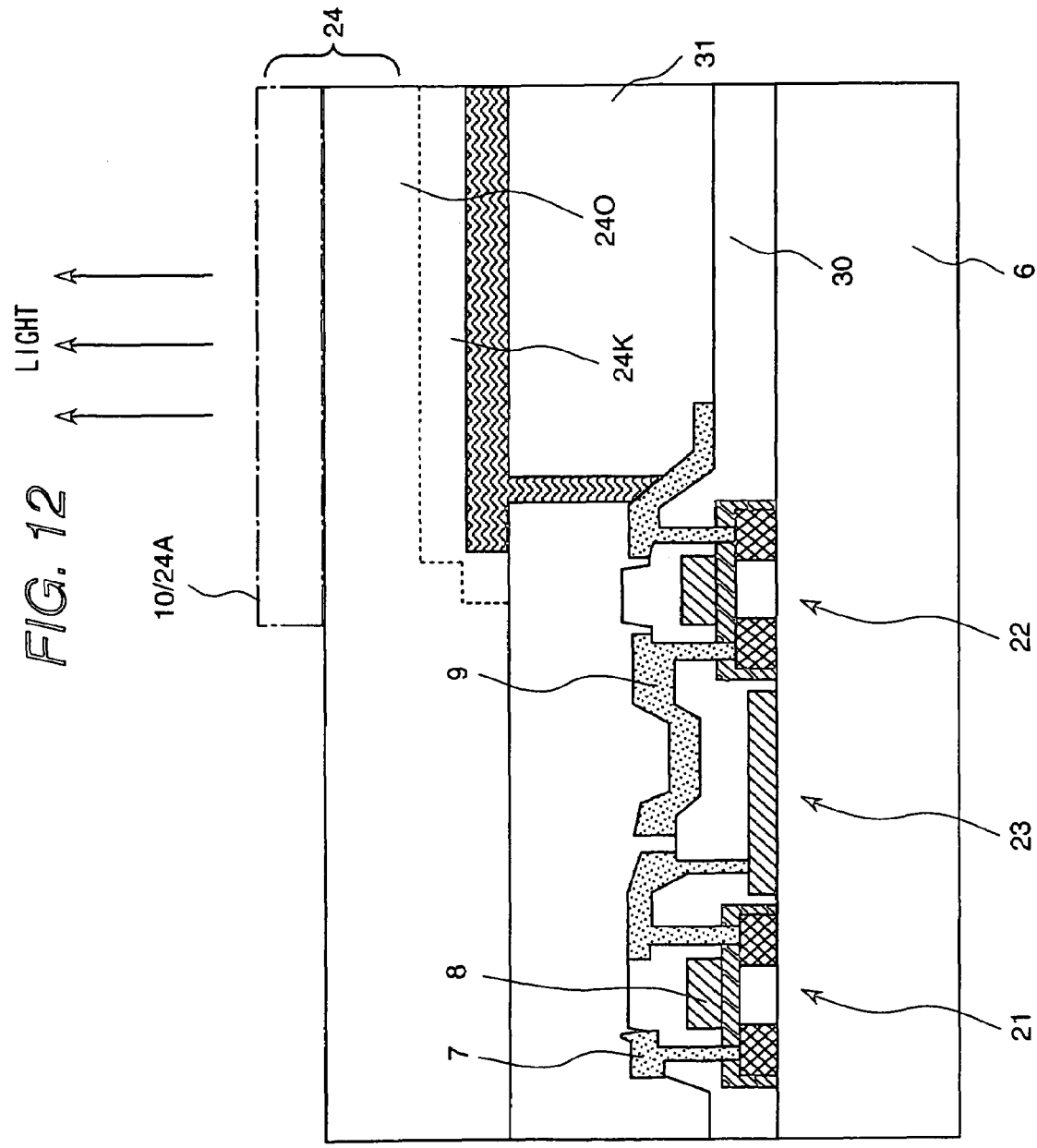
FIG. 12 is a cross sectional view taken along the line XII-XII in FIG. 11.

The formation of the stripe shaped current supply lines 10 in the FIGS. 8 and 9 embodiment will be explained with reference to FIGS. 11 and 12. FIG. 11 shows a plane structure of the pixel portion in the picture image display device 1, and FIG. 12 shows a cross sectional view taken along the line XII-XII in Fig.

On the glass substrate 6, in order to constitute the switch transistor 21 and the driver transistor 22, a silicon film in island shapes is formed, and on the surface of the silicon film a gate insulation film is formed. On the gate insulation film, gate electrodes and the gate line 8 are formed; and, thereafter, the source and drain regions for the switch transistor 21 and the driver transistor 22 are formed in a self aligned manner with respect to the gate electrodes. Then, a first inter layer insulation film 30 is provided, and the data line 7, the common potential line 9 and an electrode for the capacitor 23 are formed via contact holes.

Further, after providing a cathode 24K of the OLED 24 representing the pixel electrode via a contact hole in a second inter layer insulation film 31 and an organic layer 240 thereof, a transparent anode electrode 24A representing an opposing electrode of the OLED 24 and the current supply line 10 connected therewith are provided. The current supply line 10 is extended in the line direction, namely in the extending direction of the gate line 8.

The OLED light emitting element 24 is structured by laminating the cathode 24K which is constituted by a metal layer, such as aluminum or calcium containing lithium, and is connected over a metal layer connected to the drain of the driver transistor 22, the organic semiconductor layer 240, a hole injecting layer and a transparent anode electrode 24A constituted by an oxide film containing indium.

Figure 13:
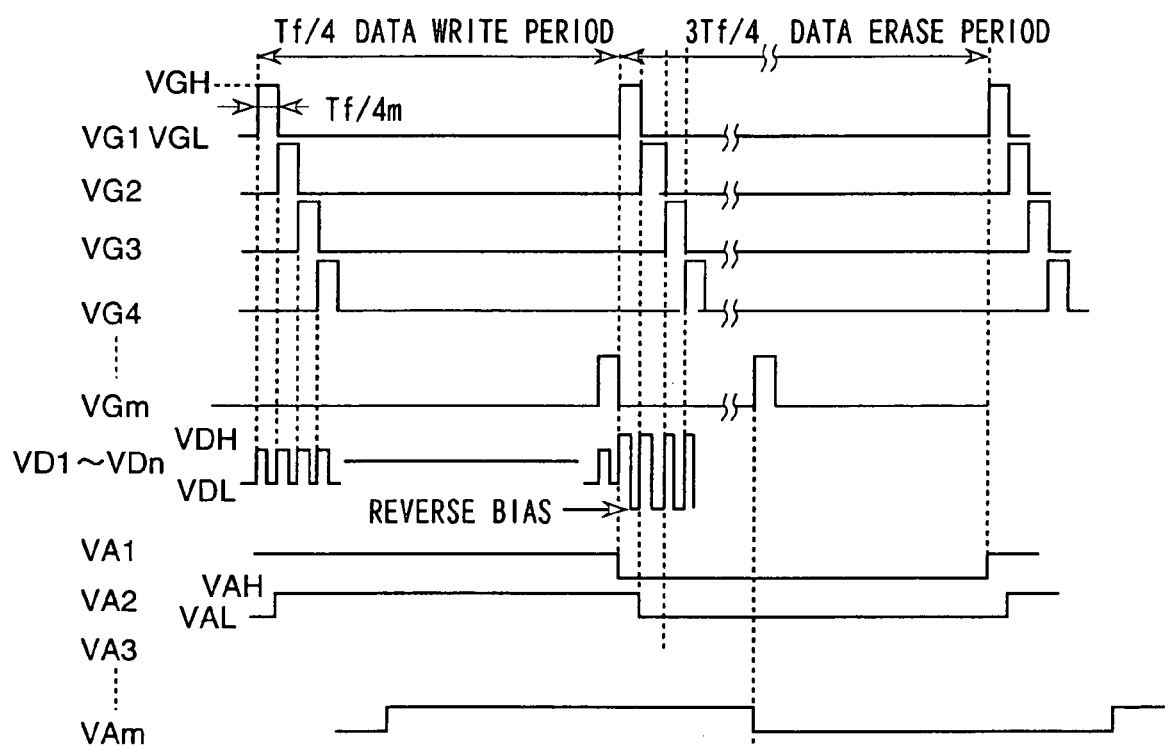
FIG. 13 is a time chart illustrating a pixel driving operation of still another embodiment according to the present invention.

FIG. 13 shows a modified method of driving the FIG. 8 embodiment. When comparing the FIG. 14 driving method with the FIG. 10 driving method, it will be apparent that, with regard to the drive voltage waveform, the ratio between the light emitting period and the light quenching period in one frame is set at 1:3 and the voltages VA1, VA2, . . . , VAm for the current supply lines 10 are rendered to the low voltage level VAL during the light quenching period, like the FIG. 10 driving method.

In the FIG. 13 driving method, with regard to the data line drive voltage, when turning off the driver transistors 22 after applying the turn-on voltage to the driver transistors 22 in synchronism with the gate reselection pulses, a voltage which is even lower than the voltage level VDL is applied, in that the feature of FIG. 13 driving method is, in particular to lower the voltage level for turning off the driver transistors 22 to a level below the potentials, such as the common potential lines 9 and the pixel electrodes.

Under the above condition, when the voltage for the gate lines 8 is rendered into a non-selection state, the gate voltage of the driver transistors 22 is kept lower than the source and drain voltages. Namely, the driver transistors 22 which are driven by a positive gate voltage during the light emitting operation are supplied with a negative gate voltage during the light quenching operation; thereby, a performance-shift of the transistors due to electric charge injection into the gate insulation films thereof and a deterioration of display picture quality in association therewith can be prevented.

As has been explained hitherto, in the picture image display device according to the present invention since the pixels are designed to be driven while interposing a light quenching period in which the electro optical elements are quenched after scanning a plurality of gate lines for displaying one picture image, the integration of the conventional white background at the time of line of sight movement is eliminated during the light quenching period, therefore, the phenomenon of blurred edges, namely the display property of the motion pictures, is substantially eliminated.

Further, in the above embodiments, since the scanning for the light quenching is performed after completing the light emission scanning, the display property of the motion pictures can be improved without modifying the pixel circuit arrangement usually employed for an active matrix type drive.

Still further, since a reverse or inverted bias is applied to the OLEDs 24 during the light quenching period, the space charge generation therein is prevented so as to prolong the life of the OLEDs 24, whereby, a picture image display device with a small brightness deterioration can be realized.

Still further, it should be understood that the present invention is not limited to the above explained embodiments. For example, the present invention can be applied to a modification of the FIGS. 11 and 12 structure in which a P channel type TFT is used for the driver transistor 22 and the light is taken out from the side of the glass substrate 6.

Still further, in the above explained embodiments a light quenching period is formed in which the electro optical elements are quenched in one frame period for displaying one picture image; however, it will be apparent that it is sufficient in principle if a light quenching period in which the electro optical elements are quenched is introduced after scanning a plurality of gate lines for displaying one picture image.

As has been explained hitherto, according to the present invention, since the pixels are driven while forming a light quenching period in which the electro optical elements are caused to be quenched after scanning a plurality of gate lines for displaying one picture image, the conventional integration of the white background is eliminated when the line of sight moves during this light quenching period, whereby the phenomenon blurred edges is prevented, namely, the display property of motion pictures is greatly improved.

The invention claimed is:

1. A picture image display device comprising pixels which are formed in a matrix shape defined by a plurality of gate lines to which scanning signals are fed and a plurality of data lines crossing thereto to which picture image signals are fed, and each pixel including an organic light emitting diode and a thin film transistor, wherein the pixels are initially driven in a light emitting portion of a frame period, and then introducing a light quenching period within each frame period, in which the organic light emitting diode is caused to be quenched for a subsequent remaining portion of the frame period following the light emitting portion, by feeding scanning signals to the plurality of gate line as well as picture image signals to the plurality of data lines after feeding scanning signals to the plurality of gate lines for displaying one picture image.

2. A picture image display device according to claim 1, wherein each pixel includes a first thin film transistor to which the scanning signals are fed via the gate line, a capacitor which holds the picture image signals fed from the data line via the first thin film transistor, a second thin film transistor to which the picture image signals held in the capacitor are fed and an organic light emitting diode which is caused light emission by a drive current flowing between a pixel electrode and an opposing electrode of the organic light emitting diode when the pixel electrode is electrically connected to a common potential line via the second thin film transistor.

3. A picture image display device according to claim 2, wherein the gate lines, the data lines, the first thin film transistors, the second thin film transistors, the capacitors and the organic light emitting diodes are mounted on a common substrate.

4. A picture image display device according to claim 1, wherein the light emitting portion of the frame period used for initially driving the pixels, is shorter in time than the subsequent remaining portion of the frame period used for quenching the organic light emitting diode.

5. A picture image display device according to claim 1, wherein the light emitting portion of the frame period used for initially driving the pixels, is substantially one-fourth of the frame period, and the subsequent remaining portion of the frame period used for quenching the organic light emitting diode is substantially three-fourths of the frame period.

6. A picture image display device for displaying motion picture images comprising pixels which are formed in a matrix shape defined by a plurality of gate lines to which scanning signals are fed and a plurality of data lines crossing thereto to which picture image signals are fed, and each pixel including an organic light emitting diode and a thin film transistor, wherein the pixels are initially driven in a light emitting portion of a frame period, and then introducing a light quenching period within each frame period, in which the organic light emitting diodes are caused to be quenched for a subsequent remaining portion of the frame period following the light emitting portion, by feeding scanning signals to the plurality of gate lines as well as feeding picture image signals for quenching the organic light emitting diodes to the plurality of data lines in synchronism with the scanning signal after feeding the scanning signals to the plurality of gate lines and causing the organic light emitting diode light emission for displaying one picture image, thereby a blurred edge of a motion picture image is prevented.

7. A picture image display device according to claim 6, wherein each pixel includes a first thin film transistor to which the scanning signals are fed via the gate line, a capacitor which holds the picture image signals fed from the data line via the first thin film transistor, a second thin film transistor to which the picture image signals held in the capacitor are fed and an organic light emitting diode which is caused light emission by a drive current flowing between a pixel electrode and an opposing electrode of the organic light emitting diode when the pixel electrode is electrically connected to a common potential line via the second thin film transistor.

8. A picture image display device according to claim 7, wherein the gate lines, the data lines, the first thin film transistors, the second thin film transistors, the capacitors and the organic light emitting diodes are mounted on a common substrate.

9. A picture image display device according to claim 6, wherein the light emitting portion of the frame period used for initially driving the pixels, is shorter in time than the subsequent remaining portion of the frame period used for quenching the organic light emitting diode.

10. A picture image display device according to claim 6, wherein the light emitting portion of the frame period used for initially driving the pixels, is substantially one-fourth of the frame period, and the subsequent remaining portion of the frame period used for quenching the organic light emitting diode is substantially three-fourths of the frame period.

11. A picture image display device comprising pixels which are formed in a matrix shape defined by a plurality of gate lines to which scanning signals are fed and a plurality of data lines crossing thereto to which picture image signals are fed, and each pixel including an organic light emitting diode and a thin film transistor, wherein the pixels are initially driven in a light emitting portion of a frame period, and then introducing a light quenching period within each frame period, in which the organic light emitting diodes are caused to be quenched for a subsequent remaining portion of the frame period following the light emitting portion, in one frame period for displaying one picture image, and wherein the light quenching period scanning signals are fed to the plurality of gate lines and the picture image signals for quenching the organic light emitting diodes are fed to the plurality of data lines in synchronism with the scanning signals.

12. A picture image display device according to claim 11, wherein each pixel includes a first thin film transistor to which the scanning signals are fed via the gate line, a capacitor which holds the picture image signals fed from the data line via the first thin film transistor, a second thin film transistor to which the picture image signals held in the capacitor are fed and an organic light emitting diode which is caused light emission by a drive current flowing between a pixel electrode and an opposing electrode of the organic light emitting diode when the pixel electrode is electrically connected to a common potential line via the second thin film transistor.

13. A picture image display device according to claim 12, wherein the gate lines, the data lines, the first thin film transistors, the second thin film transistors, the capacitors and the organic light emitting diodes are mounted on a common substrate.

14. A picture image display device according to claim 11, wherein the light emitting portion of the frame period used for initially driving the pixels, is shorter in time than the subsequent remaining portion of the frame period used for quenching the organic light emitting diode.

15. A picture image display device according to claim 11, wherein the light emitting portion of the frame period used for initially driving the pixels, is substantially one-fourth of the frame period, and the subsequent remaining portion of the frame period used for quenching the organic light emitting diode is substantially three-fourths of the frame period.

16. A picture image display device comprising pixels which are formed in a matrix shape defined by a plurality of gate lines to which scanning signals are fed and a plurality of data lines crossing thereto to which picture image signals are fed, and each pixel including an organic light emitting diode and a thin film transistor, and further comprising a display control controller which provides control to initially drive the pixels in a light emitting portion of a frame period, and then introduce a light quenching period within each frame period, in which the organic light emitting diodes are caused to be quenched for a subsequent remaining portion of the frame period following the light emitting portion, in one frame period for displaying one picture image, and feeds scanning signals to the plurality of gate lines as well as picture image signals for quenching the organic light emitting diodes to the plurality of data lines in synchronism with the scanning signals in the light quenching period.

17. A picture image display device according to claim 16, wherein each pixel includes a first thin film transistor to which the scanning signals are fed via the gate line, a capacitor which holds the picture image signals fed from the data line via the first thin film transistor, a second thin film transistor to which the picture image signals held in the capacitor are fed and an organic light emitting diode which is caused light emission by a drive current flowing between a pixel electrode and an opposing electrode of the organic light emitting diode when the pixel electrode is electrically connected to a common potential line via the second thin film transistor.

18. A picture image display device according to claim 17, wherein the gate lines, the data lines, the first thin film transistors, the second thin film transistors, the capacitors and the organic light emitting diodes are mounted on a common substrate.

19. A picture image display device according to claim 16, wherein the light emitting portion of the frame period used for initially driving the pixels, is shorter in time than the subsequent remaining portion of the frame period used for quenching the organic light emitting diode.

20. A picture image display device according to claim 16, wherein the light emitting portion of the frame period used for initially driving the pixels, is substantially one-fourth of the frame period, and the subsequent remaining portion of the frame period used for quenching the organic light emitting diode is substantially three-fourths of the frame period.

21. A picture image display device for displaying motion picture images, comprising pixels which are formed in a matrix shape defined by a plurality of gate lines to which scanning signals are fed and a plurality of data lines crossing thereto to which picture image signals are fed, and each pixel including an organic light emitting diode and a thin film transistor, wherein the pixels are initially driven in a light emitting portion of a frame period, and then introducing a light quenching period within each frame period, in which the organic light emitting diodes are caused to be quenched for a subsequent remaining portion of the frame period following the light emitting portion, for one frame period for displaying one picture image and another frame period for displaying subsequent one picture image, and scanning signals are fed to the plurality of gate lines as well as picture image signals for quenching the organic light emitting diodes are fed to the plurality of data lines in synchronism with the scanning signals in the light quenching period.

22. A picture image display device according to claim 21, wherein each pixel includes a first thin film transistor to which the scanning signals are fed via the gate line, a capacitor which holds the picture image signals fed from the data line via the first thin film transistor, a second thin film transistor to which the picture image signals held in the capacitor are fed and an organic light emitting diode which is caused light emission by a drive current flowing between a pixel electrode and an opposing electrode of the organic light emitting diode when the pixel electrode is electrically connected to a common potential line via the second thin film transistor.

23. A picture image display device according to claim 22, wherein the gate lines, the data lines, the first thin film transistors, the second thin film transistors, the capacitors and the organic light emitting diodes are mounted on a common substrate.

24. A picture image display device according to claim 21, wherein the light emitting portion of the frame period used for initially driving the pixels, is shorter in time than the subsequent remaining portion of the frame period used for quenching the organic light emitting diode.

25. A picture image display device according to claim 21, wherein the light emitting portion of the frame period used for initially driving the pixels, is substantially one-fourth of the frame period, and the subsequent remaining portion of the frame period used for quenching the organic light emitting diode is substantially three-fourths of the frame period.

* * * * *